(12) United States Patent
Wang et al.

(10) Patent No.: US 9,418,904 B2
(45) Date of Patent: Aug. 16, 2016

(54) LOCALIZED CMP TO IMPROVE WAFER PLANARIZATION

(75) Inventors: Sheng-Chen Wang, Taichung (TW); Feng-Inn Wu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 599 days.

(21) Appl. No.: 13/295,400

(22) Filed: Nov. 14, 2011

(65) Prior Publication Data

US 2013/0122613 A1 May 16, 2013

(51) Int. Cl.
*H01L 21/00* (2006.01)
*H01L 21/66* (2006.01)

(52) U.S. Cl.
CPC ............... *H01L 22/12* (2013.01); *H01L 22/20* (2013.01)

(58) Field of Classification Search
CPC .... H01L 23/528; H01L 21/4885; H01L 22/20
USPC .......... 257/773, 784, E23.024, E23.025, 257/E23.036, E23.068, E23.105, E23.141, 257/E21.627
See application file for complete search history.

(56) References Cited

U.S. PATENT DOCUMENTS

| | | | |
|---|---|---|---|
| 5,605,488 A | 2/1997 | Ohashi et al. | |
| 5,873,769 A | 2/1999 | Chiou et al. | |
| 6,020,262 A | 2/2000 | Wise et al. | |
| 6,063,301 A * | 5/2000 | Kiwada et al. | 216/103 |
| 6,077,151 A | 6/2000 | Black et al. | |
| 6,077,783 A | 6/2000 | Allman et al. | |
| 6,123,609 A * | 9/2000 | Satou | 451/285 |
| 6,135,858 A | 10/2000 | Takahashi | |
| 6,150,271 A | 11/2000 | Easter et al. | |
| 6,179,699 B1 * | 1/2001 | Costa | 451/446 |
| 6,227,939 B1 | 5/2001 | Monroe | |
| 6,299,506 B2 * | 10/2001 | Nishimura et al. | 451/8 |
| 6,368,198 B1 | 4/2002 | Sung et al. | |
| 6,598,314 B1 | 7/2003 | Kuo et al. | |
| 6,749,484 B2 | 6/2004 | Yang et al. | |
| 6,764,387 B1 * | 7/2004 | Chen | 451/41 |
| 7,153,188 B1 | 12/2006 | Zuniga et al. | |
| 7,198,055 B2 | 4/2007 | Woods et al. | |
| 7,335,088 B1 | 2/2008 | Hwamg et al. | |
| 8,182,709 B2 | 5/2012 | Heinrich et al. | |

(Continued)

FOREIGN PATENT DOCUMENTS

| | | |
|---|---|---|
| JP | 2002-231672 | 8/2002 |
| KR | 100685744 B1 | 2/2007 |
| TW | 471993 B | 1/2002 |

OTHER PUBLICATIONS

White, et al. "What is Clean, Dry Air?" CAGI—Compressed Air and Gas Institute. Nov. 1, 2005.

(Continued)

*Primary Examiner* — Marc Armand
*Assistant Examiner* — Quovaunda V Jefferson
(74) *Attorney, Agent, or Firm* — Eschweiler & Associates, LLC

(57) ABSTRACT

To provide improved planarization, techniques in accordance with this disclosure include a CMP station that utilizes localized planarization on a wafer. This localized planarization, which is often carried out in a localized planarization station downstream of a CMP station, applies localized planarization to less than the entire face of the wafer to correct localized non-planar features. Other systems and methods are also disclosed.

19 Claims, 8 Drawing Sheets

TIME = 0

TIME = 1

(56) References Cited

U.S. PATENT DOCUMENTS

| | | |
|---|---|---|
| 2001/0029155 A1* | 10/2001 | Bennett et al. ............... 451/56 |
| 2001/0049252 A1 | 12/2001 | Moore |
| 2002/0098777 A1 | 7/2002 | Laursen et al. |
| 2002/0187728 A1 | 12/2002 | Kiuchi et al. |
| 2003/0008600 A1 | 1/2003 | Ide |
| 2003/0114077 A1 | 6/2003 | Yang et al. |
| 2003/0119429 A1 | 6/2003 | Bright et al. |
| 2003/0181139 A1 | 9/2003 | Lehman et al. |
| 2004/0000328 A1 | 1/2004 | Liu et al. |
| 2004/0029333 A1* | 2/2004 | Matsukawa ............... 438/200 |
| 2004/0087248 A1 | 5/2004 | Hirokawa |
| 2004/0137829 A1 | 7/2004 | Park et al. |
| 2004/0242124 A1 | 12/2004 | Bright et al. |
| 2005/0048875 A1 | 3/2005 | Koo et al. |
| 2007/0004182 A1 | 1/2007 | Chang et al. |
| 2009/0061745 A1 | 3/2009 | Heinrich et al. |
| 2009/0170320 A1 | 7/2009 | Heinrich et al. |
| 2009/0233532 A1 | 9/2009 | Togawa et al. |
| 2010/0203806 A1 | 8/2010 | Kitakura et al. |
| 2010/0273396 A1 | 10/2010 | Kobayashi et al. |
| 2010/0291842 A1 | 11/2010 | Chen et al. |
| 2010/0314078 A1 | 12/2010 | Lin et al. |
| 2011/0124269 A1 | 5/2011 | Tada et al. |
| 2011/0159782 A1 | 6/2011 | Sone et al. |
| 2011/0189925 A1 | 8/2011 | Iravani et al. |
| 2013/0217306 A1 | 8/2013 | Wu et al. |

OTHER PUBLICATIONS

Srikanth Sundararajan, et al., "Two-Dimensional Wafer-Scale Chemical Mechanical Planarization Models Based on Lubrication Theory and Mass Transport", Journal of the Electrochemical Society, 146 (2) 761-766 (1999).

U.S. Appl. No. 13/372,872, filed Feb. 14, 2012.

Non-Final Office Action dated Aug. 14, 2014 for U.S. Appl. No. 13/372,872.

Final Office Action dated Mar. 20, 2015 for U.S. Appl. No. 13/372,872.

U.S. Appl. No. 14/829,995, filed Aug. 19, 2015.

* cited by examiner

LOCALIZED CMP TO IMPROVE WAFER PLANARIZATION

BACKGROUND

Over the last four decades, the density of integrated circuits has increased by a relation known as Moore's law. Stated simply, Moore's law says that the number of transistors on integrated circuits (ICs) doubles approximately every 18 months. Thus, as long as the semiconductor industry can continue to uphold this simple "law," ICs double in speed and power approximately every 18 months. In large part, this remarkable increase in the speed and power of ICs has ushered in the dawn of today's information age.

Unlike laws of nature, which hold true regardless of mankind's activities, Moore's law only holds true only so long as innovators overcome the technological challenges associated with it. One of the advances that innovators have made in recent decades is to use chemical mechanical polishing (CMP) to planarize layers used to build up ICs, thereby helping to provide more precisely structured device features on the ICs.

To limit imperfections in planarization, the inventors have developed improved planarization processes as described herein.

DETAILED DESCRIPTION

Figure 1A:
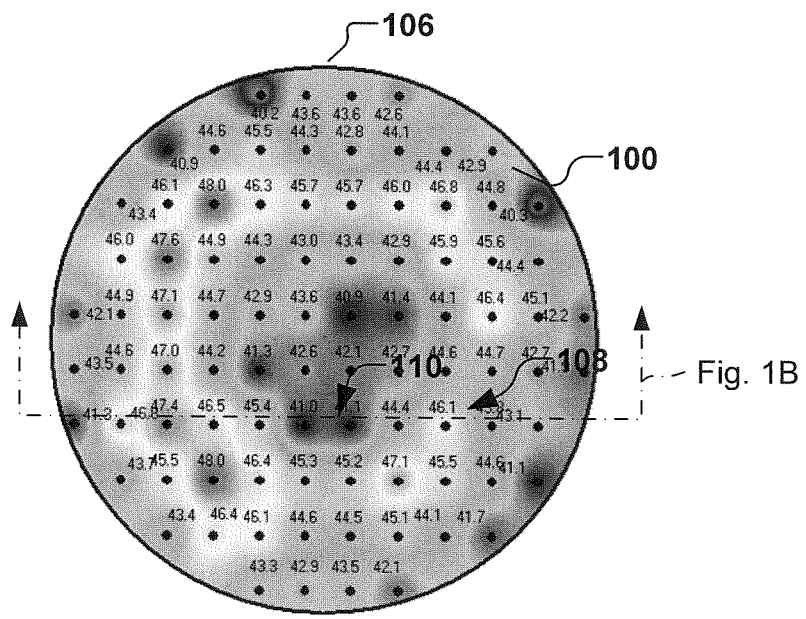
FIGS. 1A and 1B depict a wafer top view and cross-sectional side view, respectively, wherein the wafer includes hillocks and valleys after it has undergone a conventional CMP operation. Hillocks and valleys are not drawn to scale, but rather are exaggerated for purposes of understanding.

The present disclosure will now be described with reference to the drawings wherein like reference numerals are used to refer to like elements throughout, and wherein the illustrated structures are not necessarily drawn to scale. To provide improved planarization, techniques in accordance with this disclosure include a localized planarization station that performs localized planarization on a wafer. This localized planarization, which is often carried out in a localized planarization station downstream of a CMP station, performs planarization on less than the entire face of the wafer to correct localized, non-planar features. It will be appreciated that this detailed description and the corresponding figures do not limit the scope of the present disclosure in any way, and that the detailed description and figures merely provide a few examples to illustrate some ways in which the inventive concepts can manifest themselves.

Figure 1B:
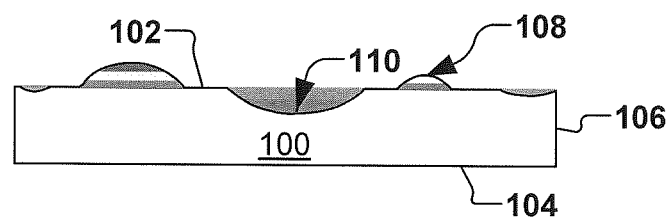

Although conventional CMP processes help to planarize IC layers, the inventors have appreciated that conventional CMP processes do not provide a perfectly planar surface in all instances. As shown in FIGS. 1A and 1B, which show a top and a cross-sectional view, respectively, of a wafer 100 having first and second surfaces 102, 104 that meet at a circumferential edge 106; difficulties in controlling planarization in localized areas can lead to hillocks 108 and/or valleys 110 on a polished surface of the wafer 100. It will be appreciated that FIG. 1B is not to scale, and that often the hillocks 108 and/or valleys 110 are very small deviations from being truly planar. Whatever the case, these hillocks 108 and/or valleys 110 can cause problems in the resultant manufactured devices.

Figure 2:
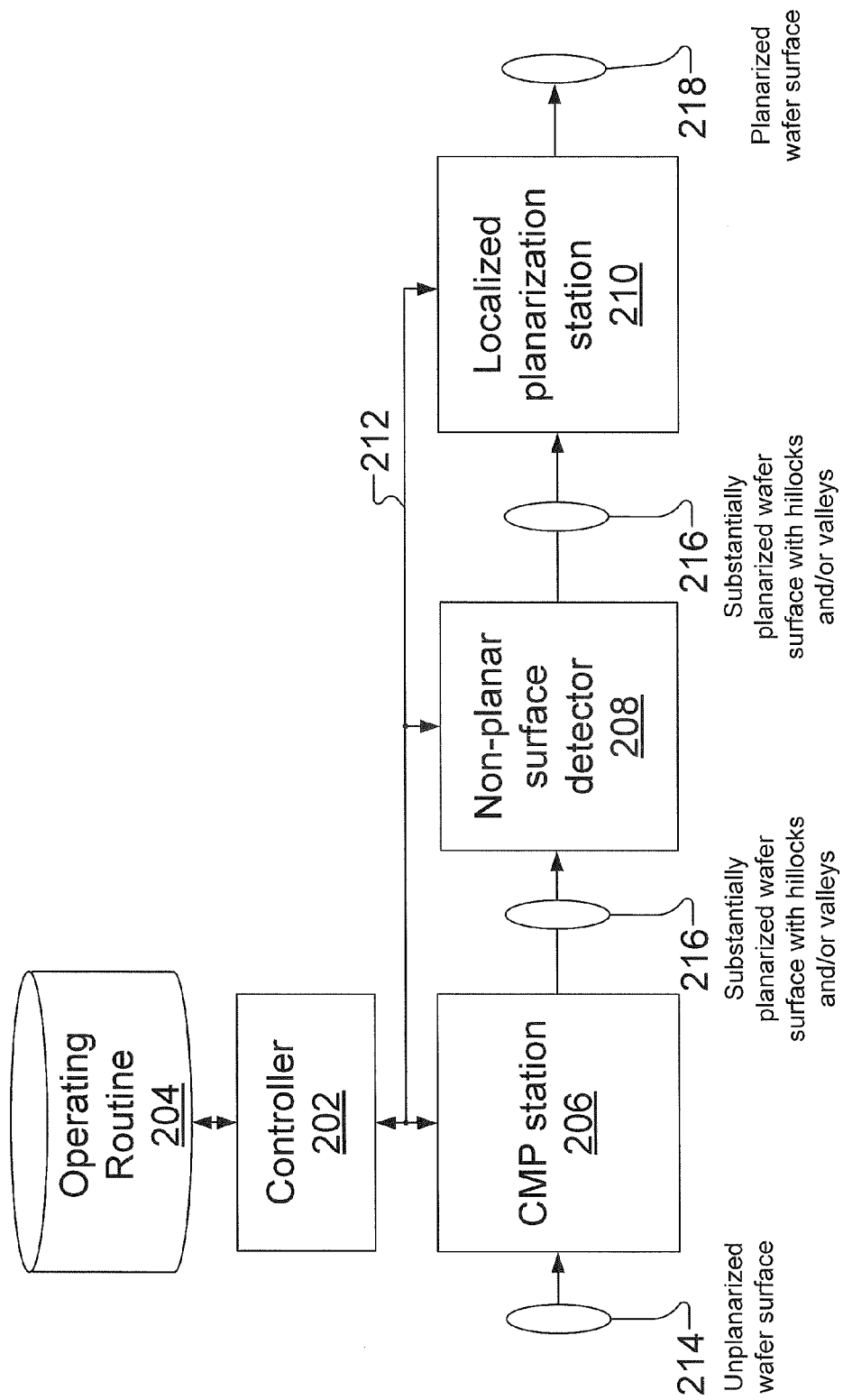
FIG. 2 is block diagram of a planarization system that includes a CMP station and a localized planarization station in accordance with some embodiments.

FIG. 2 shows a planarization system 200 that makes use of localized planarization in accordance with some embodiments of the present disclosure. The planarization system 200 can include controller 202, operating routine 204, CMP station 206, and non-planar surface detector 208 which is downstream of the CMP station 206. The planarization system also includes a localized planarization station 210, which is downstream of the CMP station 206, wherein the localized planarization station 210 is operably coupled to the non-planar surface detector 208 and/or controller 202 via control path 212.

Controller 202 comprises any general-purpose controller (e.g., DSP, microprocessor, personal computer) capable of processing operating instructions stored in the operating routine 204. The controller 202 controls the operation of CMP station 206 and localized planarization station 210 in accordance with the operating routine 204. As will be appreciated in greater detail below, the controller 202 and operating routine 204 work in coordinated fashion with the CMP station 206, localized planarization station 210, and non-planar surface detector 208 to planarize wafers or wafer structures more accurately than previously achievable.

The CMP station 206 provides CMP over an entire surface of an unplanarized wafer surface 214, to thereby provide a substantially planarized wafer surface 216. Although substantially planar, the substantially planarized wafer surface 216 may include some localized un-planarized features, such as hillocks and/or valleys on the wafer's surface (e.g., as previously shown in FIG. 1). The non-planar surface detector 208 analyzes the substantially planar wafer surface 216 to measure the locations and heights of any non-planar features. These heights and locations of the non-planar features can be used to adjust the CMP station to limit non-planar features for future wafers. In addition, for the current wafer, the localized planarization station 210 then performs localized planarization on the substantially planarized wafer surface 216, based on the measurements from the non-planar surface detector 208. By performing localized planarization on substantially planarized wafer surface 216, localized planarization station 210 is able to provide a planarized wafer surface 218 that is more planar than previously achievable.

Figure 3:
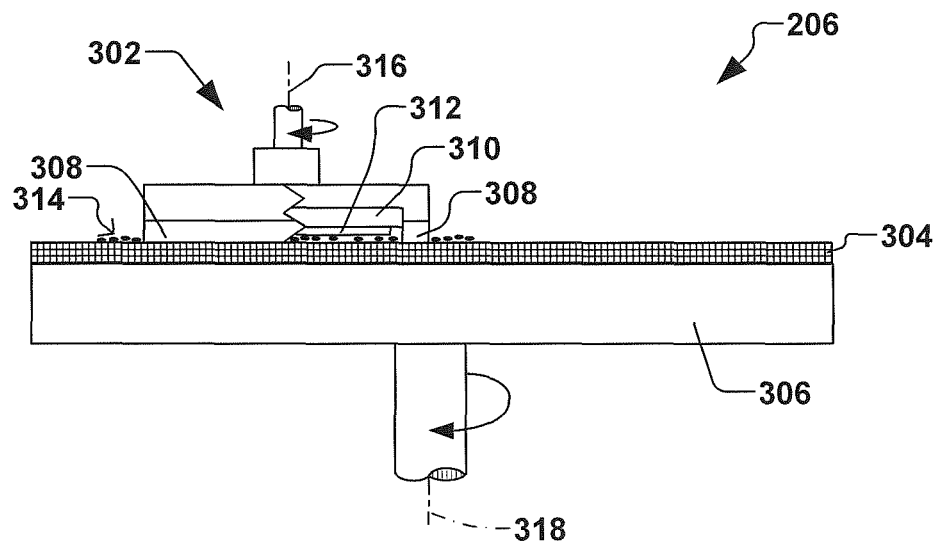
FIG. 3 is a sectional view of a CMP station during a wafer polishing operation in accordance with some embodiments.

FIG. 3 shows a side view of CMP station 206 with a wafer 312 loaded thereon in accordance with some embodiments.

CMP station 206 comprises a wafer carrier (polishing head) 302, a polishing pad 304, and a platen 306 that supports polishing pad 304. Polishing head 302 includes an annular retaining ring 308, a pocket 310 for housing a wafer 312, and a plurality of variable-pressure chambers (not shown in FIG. 3) for exerting either suction or pressure onto the backside of the wafer 312. Polishing head 302 is rotated about spindle axis 316 while platen 304 is rotated around platen axis 318 at independent rates of rotation. Abrasive slurry 314, which is comprised of abrasive slurry particles, is present during polishing. In some embodiments, the slurry particles are comprised of silica ($SiO_2$) or alumina ($Al_2O_3$), but other slurry particles can also be used depending on the surface to be polished. The combined action of the down-force of polishing head 302, the respective rotations of polishing head 302 and platen 304, and the chemical and mechanical effects of abrasive slurry 314 combine in an attempt to polish the lower surface of wafer 312 to a desired planarity and thickness.

Figure 4:
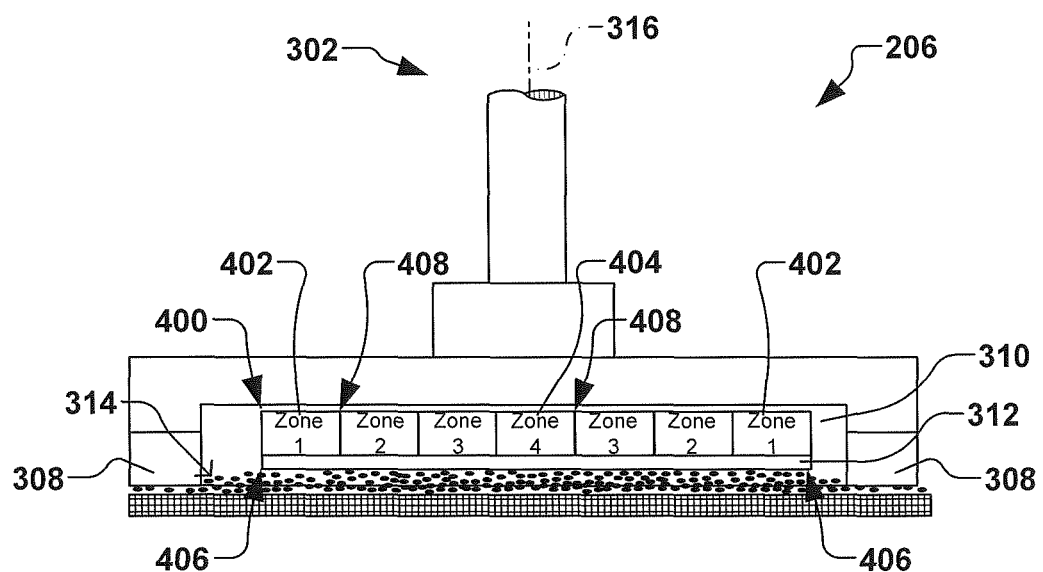
FIG. 4 is a cross-sectional close-up view of a wafer being polished by a CMP station during a CMP operation in accordance with some embodiments.

FIG. 4 shows a close up view of a polishing head 302 with multiple variable-pressure chambers 400 near a backside of the wafer 312 in accordance with some embodiments. In FIG. 4's depiction, four concentric chambers are illustrated, wherein the chambers range from a first (outermost) chamber 402, to a fourth (central) chamber 404. A controller (e.g., controller 202 in FIG. 2) allows an independent and variable down-force to be applied to each of the variable-pressure chambers 400.

In some CMP processes, wafer 312 is held inside pocket 310 with upward suction applied to its back surface by variable pressure chambers 400 so as to keep the wafer 312 raised above the lower face of retaining ring 308. A spindle motor (not shown) then begins rotating head 302 around spindle axis 316. Meanwhile, polishing head 302 is lowered, retaining ring 308 is pressed onto pad 304, with wafer 312 recessed just long enough for polishing head 302 to reach polishing speed. When polishing head 302 reaches wafer polishing speed, wafer 312 is lowered facedown inside pocket 310 to contact the surface of polishing pad 304, so that the wafer 312 is substantially flush with and constrained outwardly by retaining ring 308. Retaining ring 308 and wafer 312 continue to spin relative to pad 304, which is rotating along with platen.

After CMP, polishing head 302 and wafer 312 are lifted, and pad 304 is generally subjected to a high-pressure spray of de-ionized water to remove slurry residue and other particulate matter from the pad. Other particulate matter may include wafer residue, CMP slurry, oxides, organic contaminants, mobile ions and metallic impurities. Wafer 312 is then subjected to a post-CMP cleaning process. Similar to as previously shown in FIG. 1, the CMP station 206 may have difficulty in controlling planarization in near the circumferential outer wafer edge 406 and in the small regions 408 between adjacent pressure chambers. This difficulty can lead to non-planar features (e.g., hillocks 108 and valleys 110 as shown in FIG. 1) on a substantially planarized surface of the wafer.

Prior to carrying out localized planarization, a non-planar surface detector (e.g., 208 in FIG. 2) measures the locations and relative heights of any hillocks and/or valleys. In some embodiments, measuring the locations and relative heights of the hillocks and/or valleys is carried out by optical measurements. In some embodiments, for example, monitoring pads can be arranged in scribe lines between adjacent dies on a wafer. The monitoring pads can take any form and can also be arranged on the dies themselves, but arranging the monitoring pads in the scribe lines means the monitoring pads do not take up valuable die area. In some embodiments, the heights of these monitoring pads can be measured, for example, by polarized scatterometry techniques, which used transverse electric and transverse magnetic waves to extract complete profile information for the monitoring pads. Several such polarized scatterometry instruments are manufactured by Nova Measuring Instruments, Ltd., headquartered in Israel.

FIGS. 5A-5D illustrate operation of a localized planarization station 500 (e.g., 206 in FIG. 2) used to carry out localized planarization on a wafer in accordance with some embodiments. The localized planarization station 500 includes a wafer holder 502, as well as a planarization element 504 that can move laterally over a wafer 506 held by the wafer holder 502.

Figure 5A:
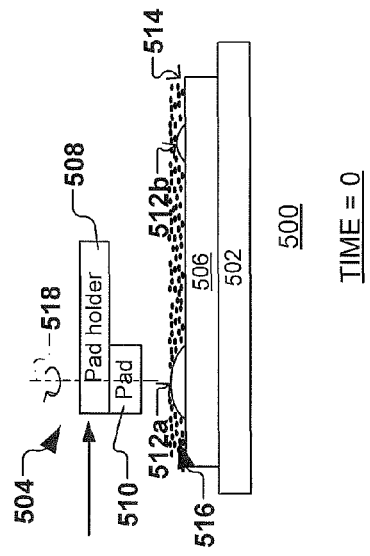
FIG. 5A is a top view of a localized planarization station that uses a lateral scanning pattern to carry out a localized planarization in accordance with some embodiments.

FIG. 5A shows a top view of the lateral scanning process, wherein the planarization element 504, which can include a pad holder 508 and a polishing pad 510 in some embodiments, is scanned laterally over the wafer 506. At each hillock 512, the planarization element is lowered onto the hillock and commences planarizing the hillock. Planarization can be carried out for a predetermined time based on a measured height for a given hillock, or can be carried out with ongoing height monitoring until a desired height or level of planarization is reached.

Figure 5B:
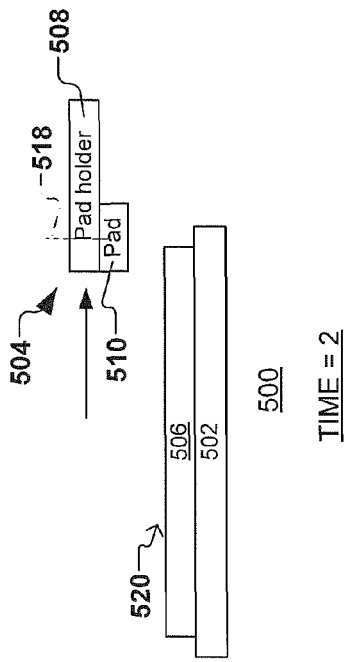
FIGS. 5B-5D are cross sectional views illustrating a wafer being polished by FIG. 5A's localized planarization station in accordance with some embodiments.
Figure 5C:
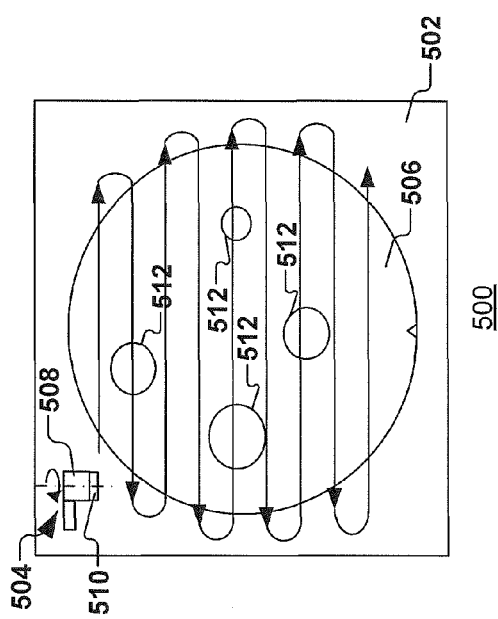
Figure 5D:
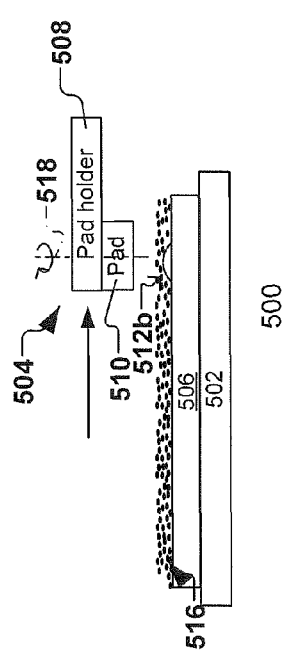

FIGS. 5B-5D show cross sections corresponding to a single lateral pass of the planarization element 504 over the wafer 506. In FIG. 5B, the localized planarization process starts with an un-planarized or substantially planarized wafer surface 514, which can include hillocks 512a, 512b. During the illustrated localized planarization process, an abrasive slurry 516 is disposed on the substantially planar wafer surface 514, and the pad holder 502 and polishing pad 510 exert a localized downward force on the wafer surface in the region of the hillock 512a. The polishing pad 510, under the direction of a controller and/or non-planar surface detector, is then axially rotated about pad axis 518 to work in combination with the slurry 516 to planarize the hillock 512a. The wafer holder 502 can often remain stationary with respect to the location of the polishing pad 510 during this localized planarization.

As shown in FIG. 5C, after the hillock 512a is planarized, the pad holder 508 and polishing pad 510 are then lifted and moved laterally (e.g., linearly) over the wafer surface until they are over the next hillock 512b. At this point, the polishing pad 510 begins rotation about pad axis 518, and is lowered to exert pressure on the next hillock 512b via the abrasive slurry 516. The rotation of the polishing pad 510 in combination with the downward force and slurry 516 planarizes the next hillock 512b. After the next hillock 512b is planarized, the pad holder 508 and polishing pad 510 are again raised, and localized planarization continues in this manner until the entire wafer surface is planarized.

After localized planarization, the polishing pad 510 is generally subjected to a high-pressure spray of de-ionized water to remove slurry residue and other particulate matter from the pad. Other particulate matter may include wafer residue, CMP slurry, oxides, organic contaminants, mobile ions and metallic impurities. Wafer 506 is then subjected to a post-localized planarization cleaning process, which provides a clean, planarized wafer surface 520, as shown in FIG. 5D.

Figure 6:
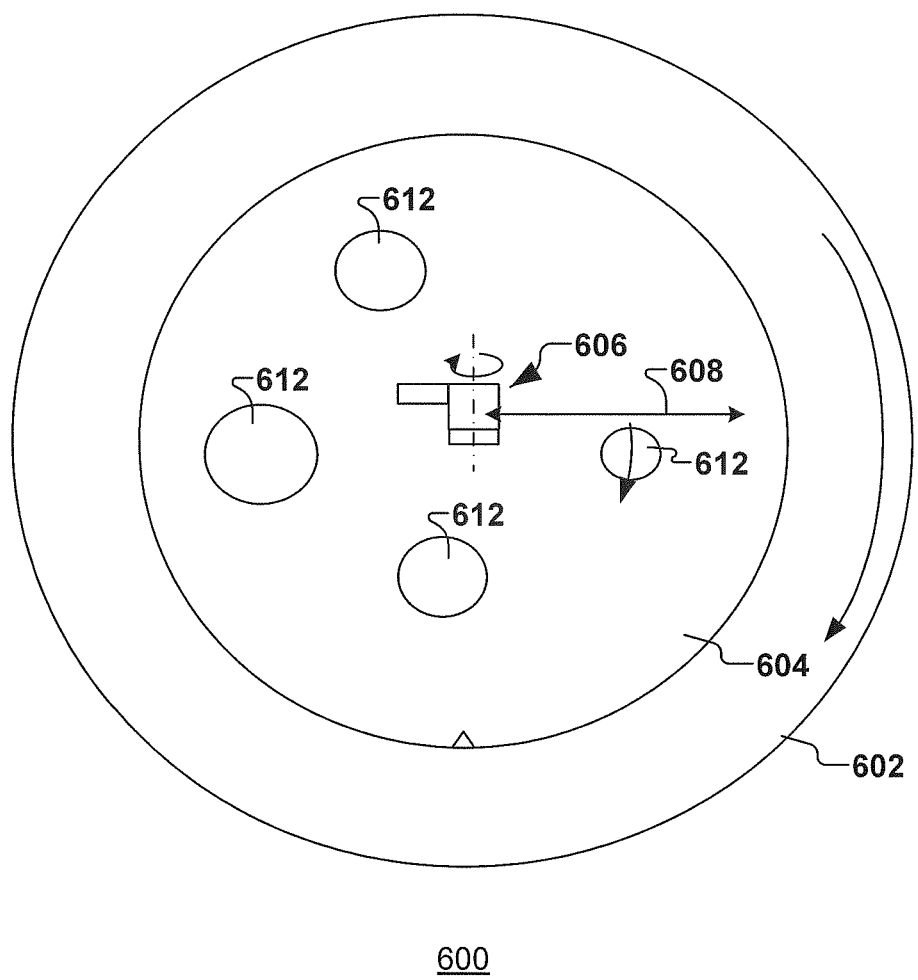
FIG. 6 is a top view of a localized planarization station that uses a radial scanning pattern to carry out a localized planarization in accordance with some embodiments.

Turning now to FIG. 6, it will be appreciated that localized planarization stations are not limited to lateral scanning patterns (e.g., as shown in FIGS. 5A-5D), but can also take the form of radially scanning planarization systems 600 in some embodiments. Like the lateral scanning localized planarization station of FIGS. 5A-5D, the radially scanning planarization system 600 includes a wafer holder 602 to hold a semiconductor wafer 604, as well as a planarization element 606 that can move over a surface of the wafer 604 to perform localized planarization on hillocks 612. Rather than scanning laterally as was done in FIGS. 5A-5D, the planarization element 606 in FIG. 6 can traverse a radius 608 (or diameter) as the wafer 604 is rotated there under. The planarization element 606 can thus perform localized planarization using radial movement at locations where hillocks 612 are detected.

Although FIGS. 5-6 have been illustrated and described above with respect to a planarization element that includes a pad holder and polishing pad, the planarization element can take different forms depending on the implementation. In other embodiments, localized planarization can make use of only a chemical component or only a physical component. As an example of a purely chemical localized planarization technique, in some embodiments the planarization element can include an etchant dispensing element (e.g., a nozzle to dispense hydrofluoric acid (HF)) and a rinse dispensing element (e.g., a nozzle to dispense de-ionized water to rinse away the HF after desired level of planarity is reached). Other reagents to also be used to carry out a localized etch. In other embodiments, a polyvinyl alcohol (PVA) brush can also be used.

Further, although localized planarization to planarize hillock features has been illustrated in FIGS. 5A-5D, it will be appreciated that localized planarization can also be used on valleys in some instances. For example, if a wafer includes a valley, which has a central low-lying area at least partially surrounded by raised sidewalls, the localized planarization techniques can "smooth out" the wafer geometry near the valley to provide a more gradual transition in height between the central low-lying area and its surrounding raised sidewalls. In some instances, this valley "smoothing" may make it easier to perform semiconductor processing steps on the valley region.

Figure 7:
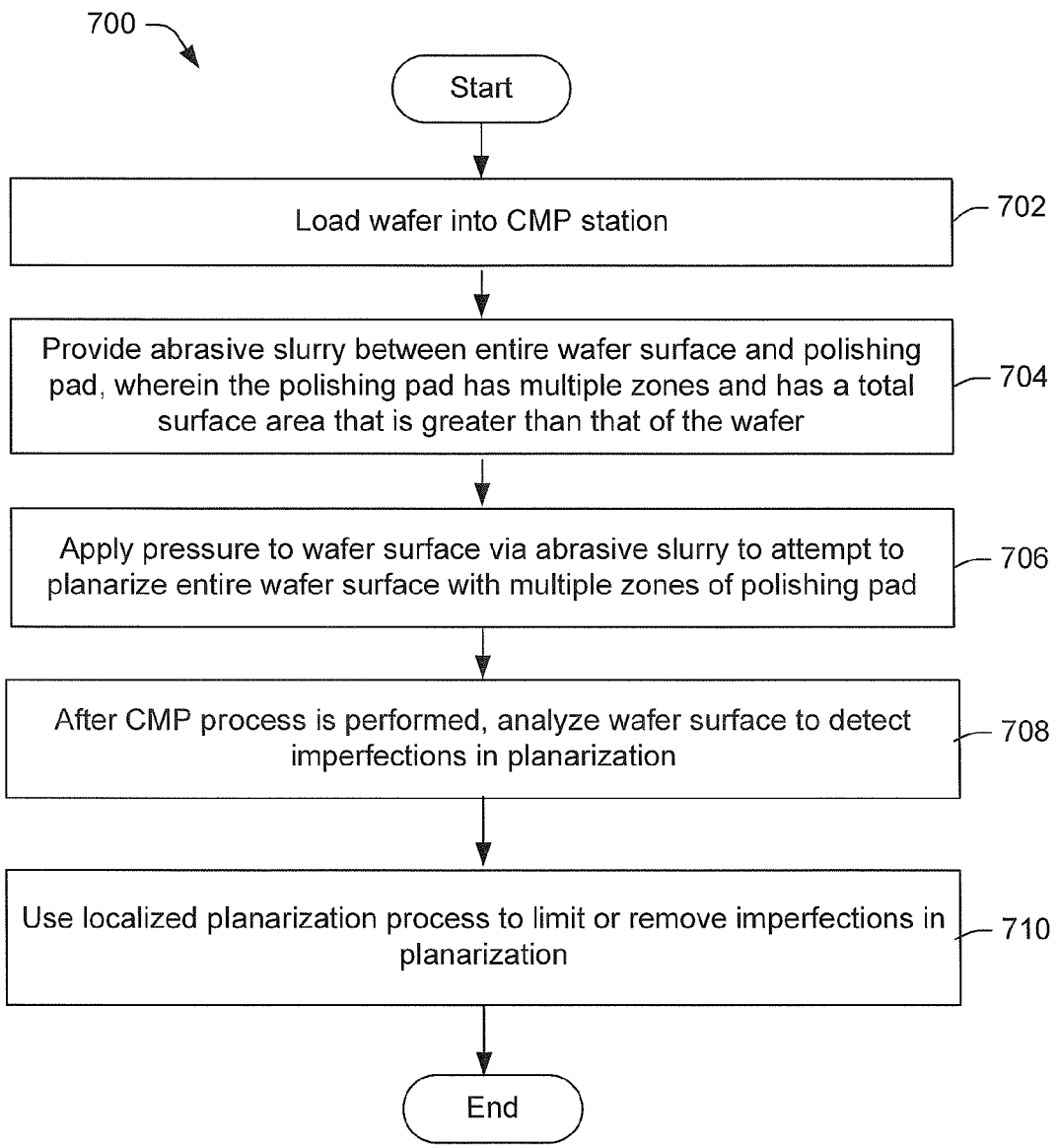
FIG. 7 is a flow diagram illustrating a method of performing a planarization process in accordance with some embodiments.

FIG. 7 illustrates another method of planarization in accordance with some embodiments of the present disclosure. While this method and other methods disclosed herein may be illustrated and/or described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Further, one or more of the acts depicted herein may be carried out in one or more separate acts and/or phases. For example, although FIG. 2 showed localized planarization being carried out in a localized planarization station 210 downstream of a CMP station 206, in other embodiments the localized planarization station 210 can provide localized planarization without a CMP station 206 previously carrying out CMP.

As FIG. 7 shows, method 700 starts at 702 when a wafer structure is loaded onto a CMP station. As previously alluded to, the CMP station planarizes wafers (or wafer structures) as part of an overall wafer fabrication process. Each wafer typically includes a number of electrical connections and electrical isolation regions that are established using alternating layers of conductors and insulators.

In step 704, the method provides an abrasive slurry between a wafer surface and a polishing pad. Often, the polishing pad has multiple independent pressure chambers and has a total surface area that is greater than that of the wafer.

In 706, the method applies pressure to the entire wafer surface via the abrasive slurry to attempt to planarize the entire wafer surface using the multiple independent pressure chambers and polishing pad. In some cases, the planarization step may cause the formation of non-planar features on the wafer surface, such that the wafer surface may also be referred to as a substantially planar surface at this point.

In 708, the method analyzes the wafer surface to detect non-planar features that correspond to imperfections in planarization.

In 710, the method uses a localized planarization process to limit or remove the non-planar features. Often the localized CMP process uses a polishing pad having a surface area that is smaller than the surface area the surface of the semiconductor wafer.

Figure 8:
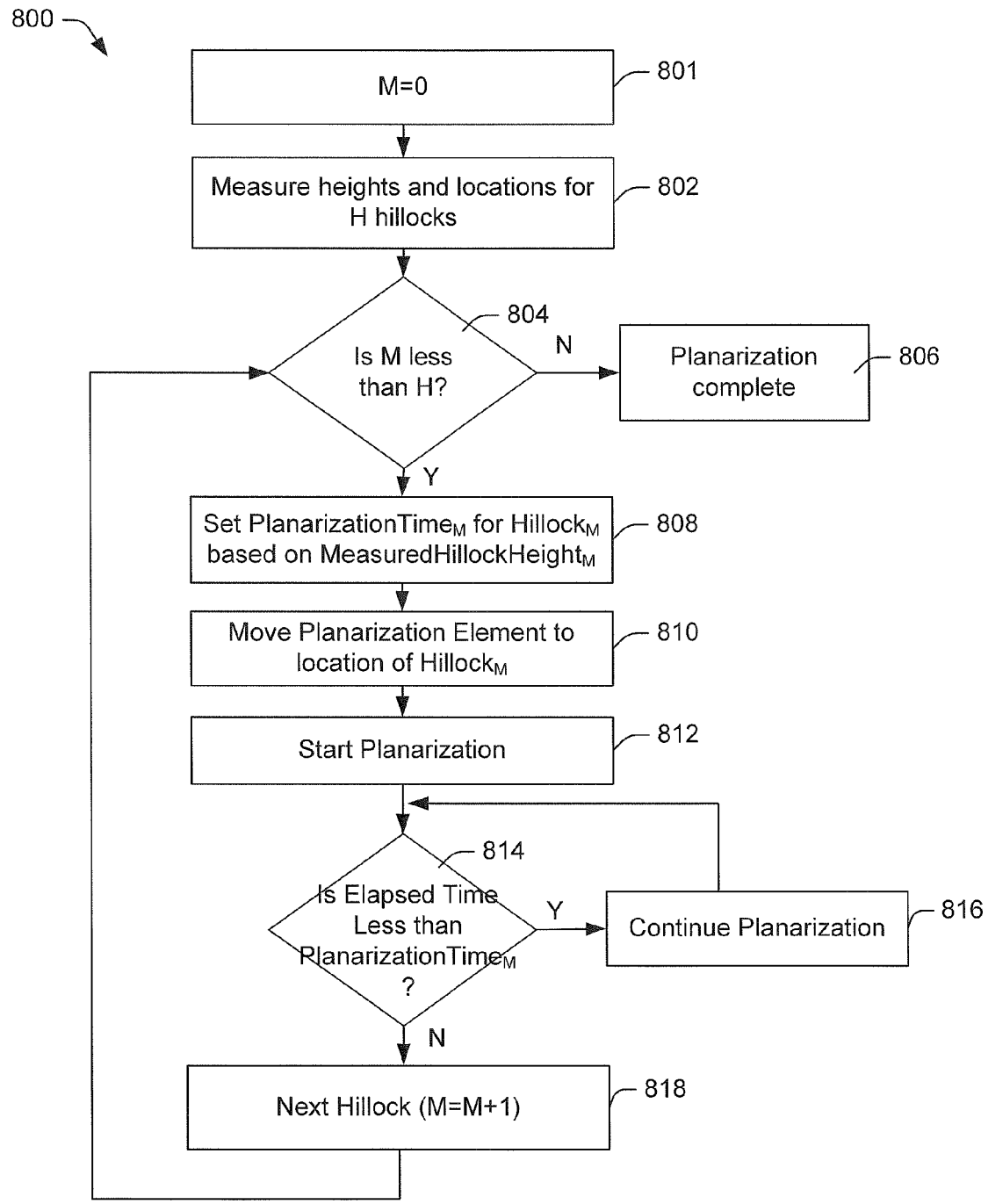
FIG. 8 is a flow diagram illustrating a method of performing a planarization process in accordance with some embodiments.

FIG. 8 shows a method 800 for localized planarization on a wafer in accordance with some embodiments. After an initialization where variable M is set to zero (801), the method 800 starts at 802 when heights and locations of an integer number, H, of hillocks are measured and recorded.

In 804, the method determines whether the current value of M is less than the number of hillocks H. If not ('N' at 804), then the planarization is considered complete and the method proceeds to 806. For example, if no hillocks are detected and H=0, then planarization is considered complete the first time 804 is evaluated.

If M is less than H ('Y' at 804), then there are still detected hillocks to be planarized, so the method proceeds to 808. In 808, a planarization time for a current hillock is set. The planarization time is based on the measured height of the current hillock. Typically, the greater a height for a given hillock, the higher the planarization time for that hillock, although other process variables (e.g., level of down force, rotational speed of polishing element, concentration of etchant) could also be altered alone or in combination with the time to achieve desired planarization levels.

In 810, the planarization element is moved to the location of the current hillock.

In 812, planarization is started. In some embodiments, a timer can be started at the start of planarization.

In 814, a comparison is made between the elapsed time since the onset of planarization and the planarization time for the current hillock. If the elapsed time is less than the planarization time for the hillock (Y at 814), then planarization continues. Eventually, the elapsed time is greater than or equal to the planarization time, and planarization is stopped for the current hillock. Thus, the method 800 proceeds to 818 and performs planarization on the next hillock (M=M+1).

Figure 9:
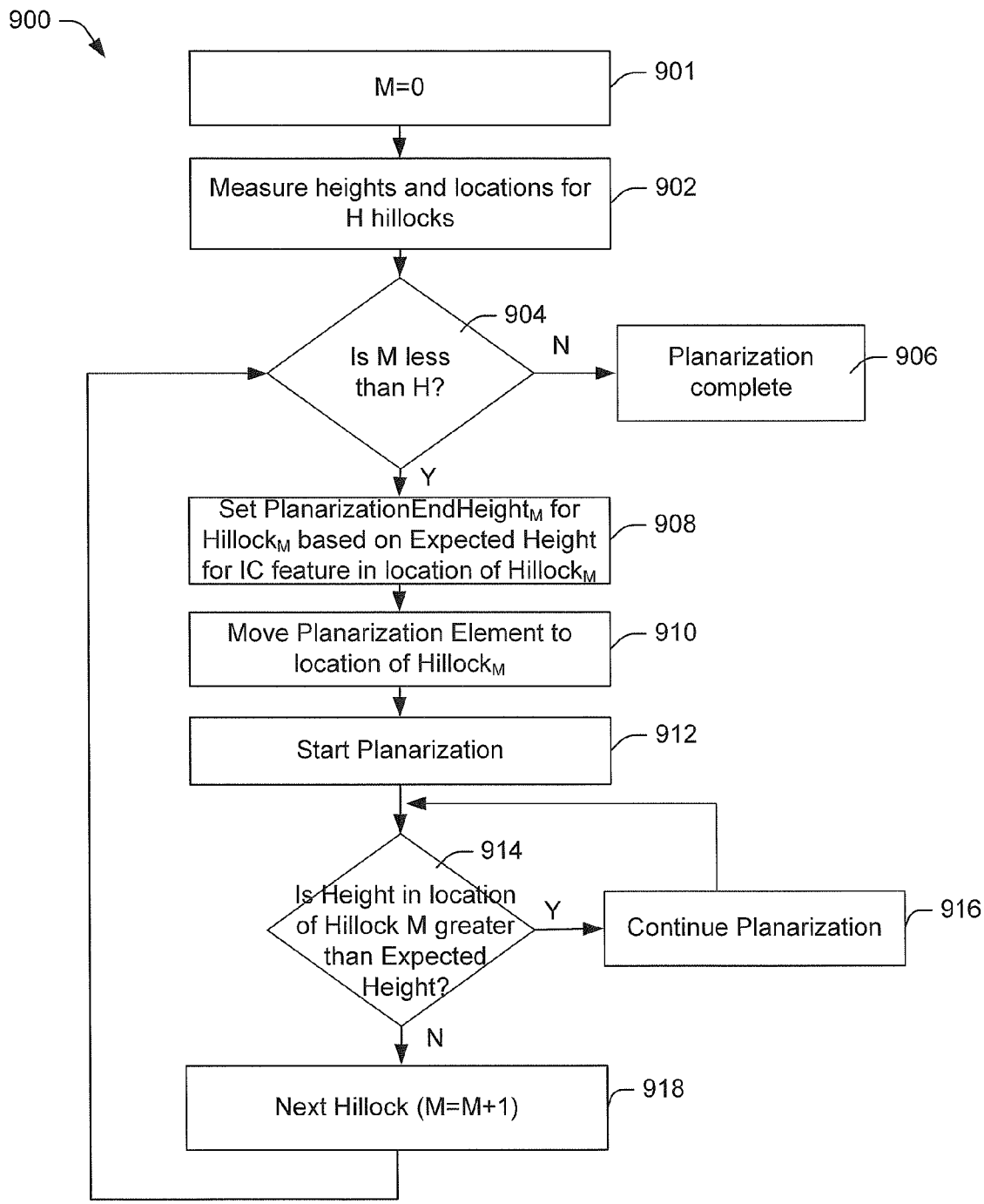
FIG. 9 is a flow diagram illustrating a method of performing a planarization process in accordance with some embodiments.

FIG. 9 shows another method 900 for localized planarization on a wafer in accordance with some embodiments. After an initialization where variable M is set to zero (901), the method 900 starts at 902 when heights and locations of an integer number, H, of hillocks are measured and recorded.

In 904, the method determines whether the current value of M is less than the number of hillocks H. If not ('N' at 904), then the planarization is considered complete and the method proceeds to 906. For example, if no hillocks are detected and H=0, then planarization is considered complete the first time 904 is evaluated.

If M is less than H ('Y' at 904), then there are still detected hillocks to be planarized, so the method proceeds to 908. In 908, a desired end height for a current hillock is set to an Expected Height for an IC features in the location of the current hillock. For example, if a hillock has a current height of 3500 angstroms (relative to a substrate surface), but an IC feature expected to be in the location of the hillock was to have a height of 3000 angstroms, the desired end height could be set to 3000 angstroms.

In 910, the planarization element is moved to the location of the current hillock.

In 912, planarization is started. In 914, the height in the location of the hillock is intermittently or continuously measured (e.g., via an optical process) as planarization is carried out, and the current height is compared to the expected height for the hillock location. So long as the current height is greater than the expected height, planarization continues in 916. When the height of the hillock region meets the expected height, planarization stops for the current hillock and the next hillock is processed in 918.

Although the disclosure has been shown and described with respect to a certain aspect or various aspects, equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the disclosure. In addition, while a particular feature of the disclosure may have been disclosed with respect to only one of several aspects of the disclosure, such feature may be combined with one or more other features of the other aspects as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of chemical mechanical polishing (CMP), comprising:
    performing chemical mechanical polishing on a wafer to provide a substantially planar wafer surface, wherein the substantially planar wafer surface includes first and second non-planar features that are spaced apart from one another by a substantially planar surface region;
    analyzing the substantially planar wafer surface to detect the first and second non-planar features thereon;
    providing a polishing pad having a surface area that is smaller than a surface area of the wafer;
    moving the polishing pad along a polishing pad axis, which is continuously perpendicular to the substantially planar wafer surface, until the polishing pad surface is proximate to the first non-planar feature;
    rotating the polishing pad surface about the polishing pad axis to locally planarize the first non-planar feature without performing localized planarization of the substantially planar surface region between the first and second non-planar features; and
    lifting the polishing pad surface along the polishing pad axis when the localized planarization of the first non-planar feature is complete.

2. The method of claim 1, wherein a volume of etchant is dispensed onto the first or second non-planar feature without the dispensed etchant covering the entire substantially planar wafer surface to locally planarize the first or second non-planar feature.

3. The method of claim 1, wherein the polishing pad comprises: a polyvinyl alcohol (PVA) brush.

4. The method of claim 1, wherein performing chemical mechanical polishing comprises:
    providing multiple independent pressures to multiple different regions on the substantially planar wafer surface, respectively.

5. The method of claim 4, wherein the multiple pressures are provided by multiple pressure chambers which are concentrically arranged with respect to one another and which are arranged to axially rotate about a spindle axis that is perpendicular to the substantially planar wafer surface of the wafer.

6. The method of claim 1, wherein the polishing pad is configured to, while rotating about the polishing pad axis, exert a force onto the first or second non-planar feature via an abrasive slurry to planarize the first or second non-planar feature.

7. The method of claim 1, wherein the polishing pad is configured to laterally and indirectly move with respect to the substantially planar surface of the wafer from the first non-planar feature to the second non-planar feature along a predefined path that is independent of locations of the first and second non-planar features.

8. The method of claim 1, wherein the polishing pad is configured to radially move with respect to the substantially planar surface of the wafer from the first non-planar feature to the second non-planar feature.

9. The method of claim 1, wherein the first or second non-planar feature comprises a hillock on the substantially planar wafer surface.

10. The method of claim 1, wherein performing chemical mechanical polishing on the wafer comprises:
    providing multiple different pressures on respective multiple different regions of the substantially planar wafer surface.

11. The method according to claim 1, wherein the polishing pad axis is fixed during local planarization of the first or second non-planar feature, until the first or second non-planar feature reaches a desired height.

12. The method according to claim 1, wherein the polishing pad is configured to individually planarize the first or second non-planar feature until a desired height is reached, as determined in real time by a non-planar surface detector.

13. A method of chemical mechanical polishing (CMP), comprising:
    performing chemical mechanical polishing on a wafer to provide a substantially planar wafer surface, wherein the substantially planar wafer surface includes first and second non-planar features that are spaced apart from one another by a substantially planar surface region;
    analyzing the substantially planar wafer surface to detect the first and second non-planar features thereon;
    providing a polyvinyl alcohol (PVA) brush having a surface area that is smaller than a surface area of the wafer;
    moving the PVA brush along a polishing pad axis, which is continuously perpendicular to the substantially planar wafer surface, until a surface of the PVA brush is proximate to the first non-planar feature;
    rotating the surface of the PVA brush about the polishing pad axis to locally planarize the first non-planar feature without performing localized planarization of the substantially planar surface region between the first and second non-planar features; and
    lifting the surface of the PVA brush along the polishing pad axis when the localized planarization of the first non-planar feature is complete.

14. The method according to claim 13, wherein the polishing pad axis is fixed during local planarization of the first or second non-planar feature, until the first or second non-planar feature reaches a desired height.

15. The method according to claim 13, wherein the PVA brush is configured to individually planarize the first or second non-planar feature until a desired height is reached, as determined in real time by a non-planar surface detector.

16. The method according to claim 13, wherein performing chemical mechanical polishing comprises:
providing multiple independent pressures to multiple different regions on the substantially planar wafer surface, respectively.

17. A method of chemical mechanical polishing (CMP), comprising:
performing chemical mechanical polishing on a wafer to provide a substantially planar wafer surface, wherein the substantially planar wafer surface includes first and second non-planar features that are spaced apart from one another by a substantially planar surface region;
providing a polishing pad having a surface area that is smaller than a surface area of the wafer;
moving the polishing pad along a polishing pad axis, which is continuously perpendicular to the substantially planar wafer surface, until a surface of the polishing pad is proximate to the first non-planar feature;
rotating the surface of the polishing pad about the polishing pad axis to locally planarize the first non-planar feature without performing localized planarization of the substantially planar surface region between the first and second non-planar features; and
lifting the surface of the polishing pad along the polishing pad axis when the localized planarization of the first non-planar feature is complete.

18. The method according to claim 17, wherein the polishing pad axis is fixed during local planarization of the first or second non-planar feature, until the first or second non-planar feature reaches a desired height.

19. The method according to claim 17, wherein performing chemical mechanical polishing comprises:
providing multiple independent pressures to multiple different regions on the substantially planar wafer surface, respectively.

* * * * *